United States Patent [19]

Simmons et al.

[11] Patent Number: 4,630,090
[45] Date of Patent: Dec. 16, 1986

[54] MERCURY CADMIUM TELLURIDE INFRARED FOCAL PLANE DEVICES HAVING STEP INSULATOR AND PROCESS FOR MAKING SAME

[75] Inventors: Arturo Simmons, Garland; Michael A. Kinch, Dallas, both of Tex.

[73] Assignee: Texas Instruments Incorporated, Dallas, Tex.

[21] Appl. No.: 654,604

[22] Filed: Sep. 25, 1984

[51] Int. Cl.⁴ .................. H01L 29/78; H01L 29/161
[52] U.S. Cl. ........................... 357/24; 357/54; 357/23.2; 357/23.15; 357/61
[58] Field of Search ............. 357/24, 24 LR, 54, 23.2, 357/23.15, 61; 29/572; 148/DIG. 43

[56] References Cited

U.S. PATENT DOCUMENTS

| | | | |
|---|---|---|---|
| 3,663,277 | 4/1972 | Koepp et al. | 357/54 |
| 3,728,784 | 4/1973 | Schmidt | 357/54 |
| 3,865,652 | 1/1975 | Agusta et al. | 357/24 LR |
| 4,197,552 | 4/1980 | Walker et al. | 357/54 |
| 4,231,149 | 11/1980 | Chapman et al. | 357/24 LR |
| 4,273,596 | 6/1981 | Gutierrez et al. | 357/24 LR |
| 4,286,278 | 8/1981 | Lorenze, Jr. et al. | 357/24 LR |
| 4,360,732 | 11/1982 | Chapman et al. | 357/24 LR |

OTHER PUBLICATIONS

Sequin et al., *Charge Transfer Devices*, Chap. 3, Bell Telephone Laboratories, 1975, pp. 26, 39–42.

*Primary Examiner*—Andrew J. James
*Assistant Examiner*—R. P. Limanek
*Attorney, Agent, or Firm*—Carlton H. Hoel; James T. Comfort; Melvin Sharp

[57] ABSTRACT

The disclosure relates to a stepped insulator process for HgCdTe infared focal plane devices, the insulator being a combination of two insulator materials, ZnS and SiO, which differ in dielectric constant and chemical reactivity. The structure is patterned on HgCdTe which has an accumulated surface region. The resulting configuration significantly reduces pin hole short circuits introduced during via etching and improves the operating range (channel stopping action) for a given step height over that of ZnS alone.

12 Claims, 2 Drawing Figures

MERCURY CADMIUM TELLURIDE INFRARED FOCAL PLANE DEVICES HAVING STEP INSULATOR AND PROCESS FOR MAKING SAME

BACKGROUND OF THE INVENTION

1. Field of the Invention

This invention relates to charge transfer devices (CTD) and, more specifically, to charge transfer devices having a stepped insulator and the method of making same.

2. Description of the Prior Art

The prior art charge transfer devices and, particularly, charge imaging devices (CID) have generally been formed on a mercury cadmium telluride (HgCdTe) substrate, normally of n-type and optionally disposed on a silicon base. An anodic passivating layer is formed on the HgCdTe substrate with a subsequent layer of zinc sulfide thereon followed by a gate layer of electrical conductor such as aluminum or nickel and then followed by a further zinc sulfide layer. A via is then etched through the upper zinc sulfide layer to the electrically conductive layer to provide access to the electrically conductive layer from the exterior of the device. A bonding pad is then formed over the top zinc sulfide layer extending through the via to the electrically conductive layer. Though these prior art CID arrays have operated satisfactorily, individual devices have often been found to be short circuited between the HgCdTe substrate and the electrically conductive layer after addition of electrically conductive material into the vias, thereby decreasing the yield. It is believed that this problem arises due to pin holes found in the electrically conductive layer which permits the etchant for the zinc sulfide to pass therethrough and also etch an unwanted via in the zinc sulfide layer formed directly over the HgCdTe substrate. In addition, it is known that HgCdTe devices are incapable of operating at high voltages and it is desirable in the case of CID arrays to have a large operating voltage range in order to be able to clearly define the active region of the device from the channel. This has remained a problem with HgCdTe devices.

SUMMARY OF THE INVENTION

In accordance with the present invention, the above problems noted in charge transfer devices and specifically in charge imaging devices are materially reduced and there is provided a charge transfer device in the form of a CID array which provides both greater operating voltage range and also materially reduces the problem of short circuiting between the HgCdTe substrate and the electrically conductive gate layer. Briefly, this is accomplished by providing a stepped insulator over the HgCdTe substrate wherein the insulating layer thickness is decreased over the active region. In addition, the insulating region is formed from layers of two different materials, the lower layer adjacent the HgCdTe substrate being formed from a material with a high dielectric constant, preferably ZnS, and an upper layer formed from a material having a relatively low dielectric constant and which, preferably, also acts as an etch stop for the etchant utilized to form the vias to the electrically conductive gate layer. Silicon oxide has been found to be a preferred such material.

In the formation of a CID array in accordance with the present invention, an n-type HgCdTe substrate is provided which can optionally be placed on a silicon base. The substrate then has a passivating layer formed on the surface thereof in the form of an anodic oxide, it being assumed that the surface of the substrate is now in accumulation. This is generally the case when working with n-type material which has an anodic oxide passivating layer. The zinc sulfide layer is then formed over the anodic oxide and the silicon oxide layer is then formed over the zinc sulfide layer. The silicon oxide layer is then patterned using a neutral beam ion mill to remove a portion thereof down to the zinc sulfide layer at the various regions where the CID devices of the array are to be formed. The regions therebelow in the HgCdTe substrate will be the active regions of the devices and are where the charge will be stored and manipulated in the finally formed devices. An electrically conductive layer, preferably nickel or aluminum, is then formed over the patterned silicon oxide, the conductive layer being disposed on the zinc sulfide layer in those regions where the silicon oxide has been removed. A second zinc sulfide layer is now formed over the electrically conductive layer and vias are then formed through the second zinc sulfide layer to the electrically conductive layer by etching to provide access to the electrically conductive layer from points external to the devices. Such access is provided by depositing an electrically conductive bond pad on the surface of the second zinc sulfide layer and into the vias to contact the electrically conductive layer.

It can be seen that, in accordance with the above described device and method, there is provided a charge transfer device in the form of a CID array which is capable of operating at greater operating voltages than similar prior art devices and which provides a stop for etchant for formation of vias in the structure to materially reduce short circuits due to pin holes and the like as encountered in prior art production techniques.

DESCRIPTION OF THE PREFERRED EMBODIMENT

Figure 1:
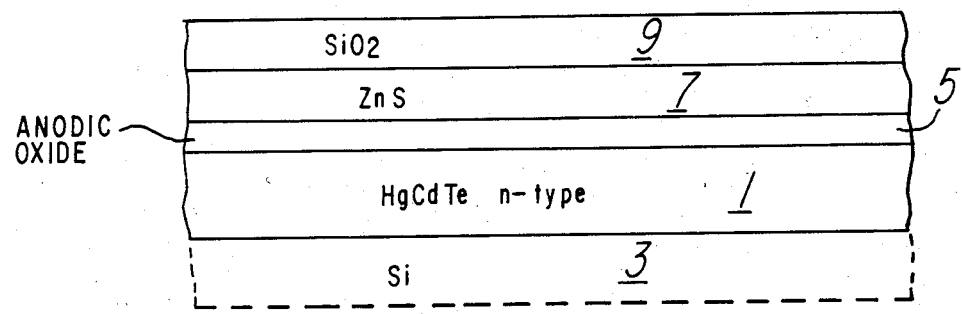
FIG. 1 is a schematic diagram of a partially completed CID formed in accordance with the present invention.
Figure 2:
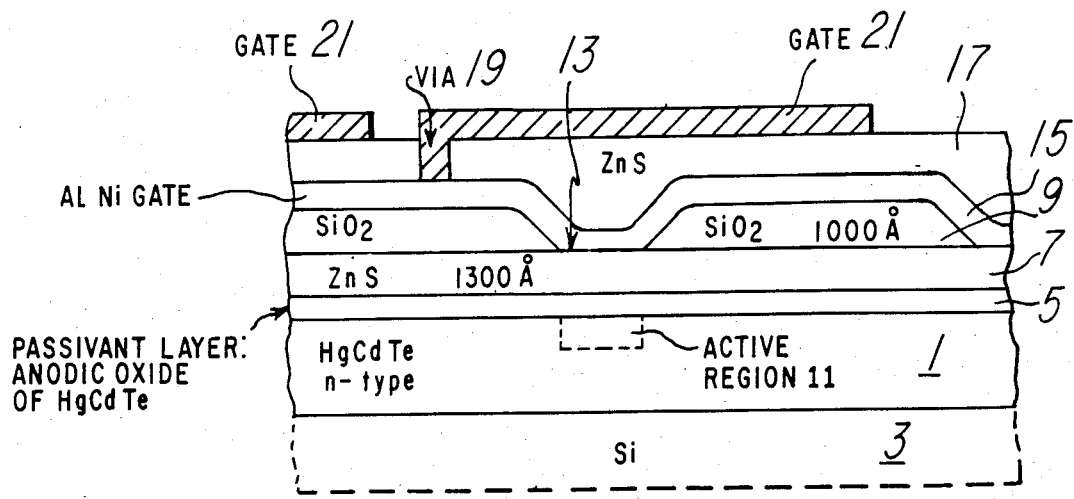
FIG. 2 is a schematic diagram of a completed CID formed in accordance with the present invention.

Referring now to FIG. 1, there is shown a partially completed CID array portion formed in accordance with the present invention. The HgCdTe substrate 1 is preferably of n-type and is optionally disposed on a silicon base 3. An anodic oxide acting as a passivant layer is formed over the substrate 1 by placing the substrate into an electrolyte solution to form an oxide of the HgCdTe in known manner which is the anodic oxide. A zinc sulfide layer 17 having a thickness of 1300 Angstroms is then deposited over the passivating layer 5 by vacuum deposition followed by a 1000 Angstrom silicon oxide layer 9 which is also vacuum deposited over the zinc sulfide layer 7. The silicon oxide layer 9 is then patterned using a neutral beam ion mill to remove the silicon oxide in those regions where the individual devices of the array are to be formed and beneath which the active regions 11 as shown in FIG. 2 will be formed. The regions 13 of the array from which the silicon has been removed will be preferably in a matrix arrangement over the substrate 1.

An electrically conductive layer 15, which will be preferably of aluminum, though nickel will be used in the event an infrared transmissive layer is required, is then deposited over the surface of the device of FIG. 2 as formed subsequent to the patterning of the silicon oxide layer 9, the electrically conductive layer 15 taking the shape of the device surface when deposited as shown in FIG. 2. A second zinc sulfide layer 17 is then formed over the electrically conductive layer 15 by vacuum deposition in the same manner as the zinc sulfide layer 7 and a via 19 is then formed by etching through the zinc sulfide layer 17 to the electrically conductive layer 15 with a standard zinc sulfide etchant with the silicon oxide layer 9 acting as an etch stop for the etchant to prevent the continuation of etching through the lowest zinc sulfide layer 7. A preferred etchant is bromine in methanol. Electrically conductive bond pads 21 are then formed over the zinc sulfide layer 17 and through the via 19 to provide external access to the gate 15 to provide the completed CID array.

What is claimed is:

1. A charge transfer device which comprises, in combination:
   (a) a semiconductor substrate of predetermined conductivity type;
   (b) an oxide layer on said substrate having a predetermined amount of fixed charge opposite to said predetermined conductivity type;
   (c) a first insulating layer of relatively high dielectric constant disposed over a surface of said oxide layer;
   (d) a second insulating layer of relatively low dielectric constant selectively disposed over portions of said first insulating layer to expose regions of said first insulating layer therethrough; and
   (e) a first electrically conductive layer disposed over said second insulating layer and following the contour onto the exposed regions of said first insulating layer.

2. A charge transfer device as set forth in claim 1 wherein said first and second insulating layers are each of substantially uniform thickness, whereby a step is formed at each of said exposed regions.

3. A charge transfer device as set forth in claim 1 further including a third insulating layer disposed over said first conductive layer, a via in said third insulating layer extending to said first conductive layer and a second electrically conductive layer disposed on said third insulating layer and extending into said via to contact said first conductive layer.

4. A charge transfer device as set forth in claim 2 further including a third insulating layer disposed over said first conductive layer, a via in said third insulating layer extending to said first conductive layer and a second electrically conductive layer disposed on said third insulating layer and extending into said via to contact said first conductive layer.

5. A charge transfer device as set forth in claim 1 wherein said first insulating layer is zinc sulfide and said second insulating layer is silicon oxide.

6. A charge transfer device as set forth in claim 2 wherein said first insulating layer is zinc sulfide and said second insulating layer is silicon oxide.

7. A charge transfer device as set forth in claim 3 wherein said first insulating layer is zinc sulfide and said second insulating layer is silicon oxide.

8. A charge transfer device as set forth in claim 4 wherein said first insulating layer is zinc sulfide and said second insulating layer is silicon oxide.

9. A charge transfer device as set forth in claim 5 wherein said substrate is HgCdTe.

10. A charge transfer device as set forth in claim 6 wherein said substrate is HgCdTe.

11. A charge transfer device as set forth in claim 7 wherein said substrate is HgCdTe.

12. A charge transfer device as set forth in claim 8 wherein said substrate is HgCdTe.

* * * * *